US012604590B2

(12) United States Patent
Sung et al.

(10) Patent No.: US 12,604,590 B2
(45) Date of Patent: Apr. 14, 2026

(54) LIGHT EMITTING MODULE AND DISPLAY DEVICE COMPRISING REFLECTIVE LAYER SURROUNDING THE LIGHT EMITTING UNITS

(71) Applicant: InnoLux Corporation, Miao-Li County (TW)

(72) Inventors: Li-Wei Sung, Miao-Li County (TW); Hsuan-Yu Yu, Miao-Li County (TW); Chien-Tzu Chu, Miao-Li County (TW); Chueh-Yuan Nien, Miao-Li County (TW); Chia-Lun Chen, Miao-Li County (TW); Kuo-Tsun Huang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 672 days.

(21) Appl. No.: 17/668,948

(22) Filed: Feb. 10, 2022

(65) Prior Publication Data

US 2022/0293674 A1     Sep. 15, 2022

(30) Foreign Application Priority Data

Mar. 10, 2021     (CN) .......................... 202110258829.1
Apr. 26, 2021     (CN) .......................... 202110451107.8

(51) Int. Cl.
 *H10H 29/14*  (2025.01)
 *H10H 20/814*  (2025.01)
 *H10H 20/853*  (2025.01)

(52) U.S. Cl.
 CPC ........ *H10H 29/142* (2025.01); *H10H 20/814* (2025.01); *H10H 20/853* (2025.01)

(58) Field of Classification Search
CPC ... H01L 27/156; H01L 25/0753; H01L 33/10; H01L 33/60; H01L 33/52; G02F 1/133605; G02F 1/133603; G02F 1/133614; H10H 29/142; H10H 20/814; H10H 20/852; H10H 20/856
USPC ............................................... 257/79; 438/22
See application file for complete search history.

(56) References Cited

U.S. PATENT DOCUMENTS

| | | | | |
|---|---|---|---|---|
| 2011/0182085 A1* | 7/2011 | Ko | ............................ | F21S 4/28 |
| | | | | 257/88 |
| 2013/0015472 A1* | 1/2013 | Lo | ........................ | H01L 25/0753 |
| | | | | 257/E33.059 |
| 2013/0037830 A1* | 2/2013 | Jang | ..................... | H10H 20/856 |
| | | | | 257/E33.056 |
| 2013/0183787 A1* | 7/2013 | Inobe | ................... | H10H 20/852 |
| | | | | 438/65 |

(Continued)

FOREIGN PATENT DOCUMENTS

| | | |
|---|---|---|
| CN | 102042568 A | 5/2011 |
| CN | 102738355 A | 10/2012 |

(Continued)

*Primary Examiner* — Didarul A Mazumder

(74) *Attorney, Agent, or Firm* — Muncy, Geissler, Olds & Lowe, P.C.

(57) ABSTRACT

A light emitting module and a display device including the same are disclosed. The light emitting module including: a substrate; a plurality of light emitting units disposed on the substrate; a plurality of encapsulating elements covering the plurality of light emitting units; and a reflective layer surrounding each of the plurality of light emitting units.

15 Claims, 10 Drawing Sheets

(56) References Cited

U.S. PATENT DOCUMENTS

| | | | |
|---|---|---|---|
| 2015/0036317 A1 | 2/2015 | Yamamoto et al. | |
| 2016/0252218 A1 | 9/2016 | Fujikawa et al. | |
| 2016/0276320 A1 | 9/2016 | Hung et al. | |
| 2017/0005238 A1* | 1/2017 | Hung | H10H 20/851 |
| 2017/0082897 A1* | 3/2017 | Yu | G02F 1/133606 |
| 2018/0166424 A1* | 6/2018 | Sim | H10H 20/853 |
| 2019/0355886 A9 | 11/2019 | Russell | |

FOREIGN PATENT DOCUMENTS

| | | | |
|---|---|---|---|
| TW | 201242097 A | 10/2012 |
| WO | 2020006948 A | 1/2020 |

* cited by examiner

100

21 22

30

C    C' d2

100

Z

Y → X

20

21 22    22a

30

10 d2

LIGHT EMITTING MODULE AND DISPLAY DEVICE COMPRISING REFLECTIVE LAYER SURROUNDING THE LIGHT EMITTING UNITS

CROSS REFERENCE TO RELATED APPLICATION

This application claims the benefits of the Chinese Patent Application Serial Number 202110258829.1, filed on Mar. 10, 2021 and the Chinese Patent Application Serial Number 202110451107.8, filed on Apr. 26, 2021, the subject matter of which is incorporated herein by reference.

BACKGROUND

1. Field

The present disclosure provides a light emitting module and a display device comprising the same, wherein the light emitting module comprises a material with high reflectivity.

2. Description of Related Art

With the continuous advancement of science and technology, display technology has also been continuously improved. At the same time, in order to meet the requirements of consumers for the display quality of display devices, various manufacturers are all committed to the development of improving the display quality of display devices.

In the conventional light emitting module, a reflective coating or a reflective sheet is used to increase the utilization efficiency of the light source to increase the light output of the light emitting module. However, the reflectivity of the conventional reflective coating is not good, and the yellowing problems may be occurred when the conventional reflective coating is placed in high temperature environment for a long time. On the other hand, the reflective sheet may be warped or deformed in the high temperature or high humidity environment. In addition, the reflective sheet may also susceptible to the limitation of the assembly limit, resulting in the reflective area reduced and the light output of the light emitting module being affected.

Therefore, it is desirable to provide a light emitting module in which the light output of the light emitting module can be improved.

SUMMARY

The present disclosure provides a light emitting module and a display device comprising the same, wherein the overall brightness of the light emitting module can be enhanced by improving the reflective layer of the light emitting module.

To achieve the object, the present disclosure provides a light emitting module, comprising: a substrate; a plurality of light emitting units disposed on the substrate; a plurality of encapsulating elements covering the plurality of light emitting units; and a reflective layer surrounding each of the plurality of light emitting units.

The present disclosure also provides a display device, comprising: a light emitting module; and a display panel disposed on the light emitting module. Herein, the light emitting module comprises: a substrate; a plurality of light emitting units disposed on the substrate; a plurality of encapsulating elements covering the plurality of light emitting units; and a reflective layer surrounding each of the plurality of light emitting units.

In addition, the present disclosure further provides another light emitting module, comprising: a plurality of light emitting units; a reflective layer surrounding each of the plurality of light emitting units; and a reflective sheet having a plurality of openings, wherein at least one of the plurality of light emitting units is disposed in at least one of the plurality of openings, and a portion of the reflective layer is disposed in the at least one of the plurality of openings. Herein, a reflectivity of the reflective layer is less than a reflectivity of the reflective sheet, and a difference between the reflectivity of the reflective layer and the reflectivity of the reflective sheet is less than or equal to 10%.

Other novel features of the disclosure will become more apparent from the following detailed description when taken in conjunction with the accompanying drawings.

DETAILED DESCRIPTION OF EMBODIMENT

Figure 1:
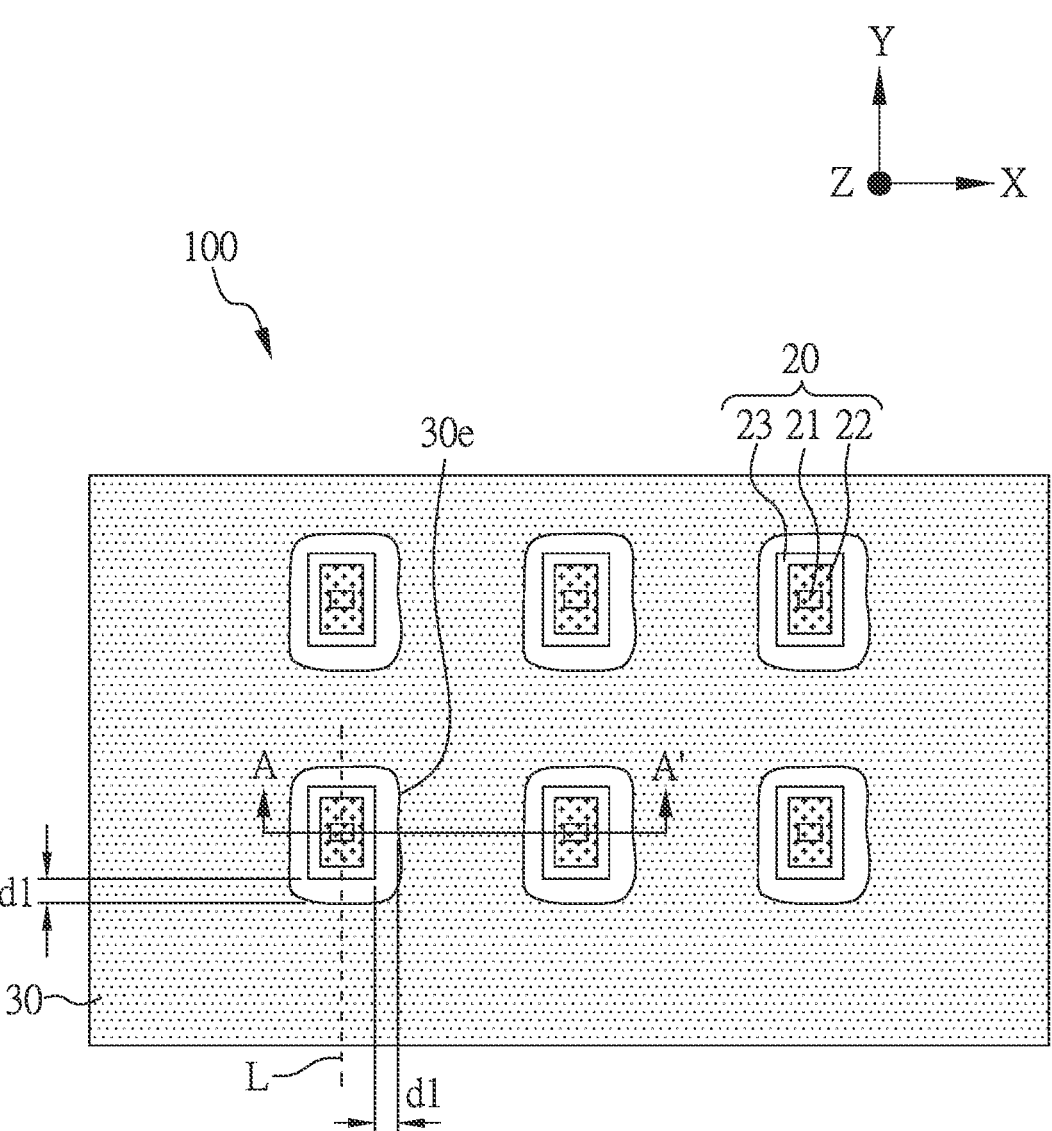
FIG. 1 is a schematic top view of a portion of a light emitting module according to one embodiment of the present disclosure.

The following is specific embodiments to illustrate the implementation of the present disclosure. Those who are familiar with this technique can easily understand the other advantages and effects of the present disclosure from the content disclosed in the present specification. The present disclosure can also be implemented or applied by other different specific embodiments, and various details in the present specification can also be modified and changed according to different viewpoints and applications without departing from the spirit of the present disclosure.

The content of the present disclosure will be described in detail below accompanying with specific embodiments and drawings. In order to make the content clearer, the following drawings may be simplified schematic diagrams, and the components may not be drawn to scale. The number, size, and arrangement of the components in the drawings are only for illustration, and are not used to limit the present disclosure.

Furthermore, the ordinals recited in the specification and the claims such as "first", "second", "third" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

In the present disclosure, the terms "almost", "about" and "approximately" usually mean within 20%, within 10%, within 5%, within 3%, within 2%, within 1%, or within 0.5% of a given value or range. The quantity given here is an approximate quantity, that is, without specifying "almost", "about" and "approximately", it can still imply "almost", "about" and "approximately".

Furthermore, the terms recited in the specification and the claims such as "above", "over", or "on" are intended not only directly contact with the other element, but also intended indirectly contact with the other element. Similarly, the terms recited in the specification and the claims such as "below", or "under" are intended not only directly contact with the other element but also intended indirectly contact with the other element.

In the present disclosure, various measurement methods may be used to measure reflectivity, such as a spectrophotometer (KONICA MINOLTA CM-2002), etc.

The detailed structure of the light emitting module of the present disclosure will be described in detail below, but the present disclosure is not limited to the following exemplary embodiments. The disclosed embodiments can be combined with each other or other known structures to form another embodiment.

Figure 2A:
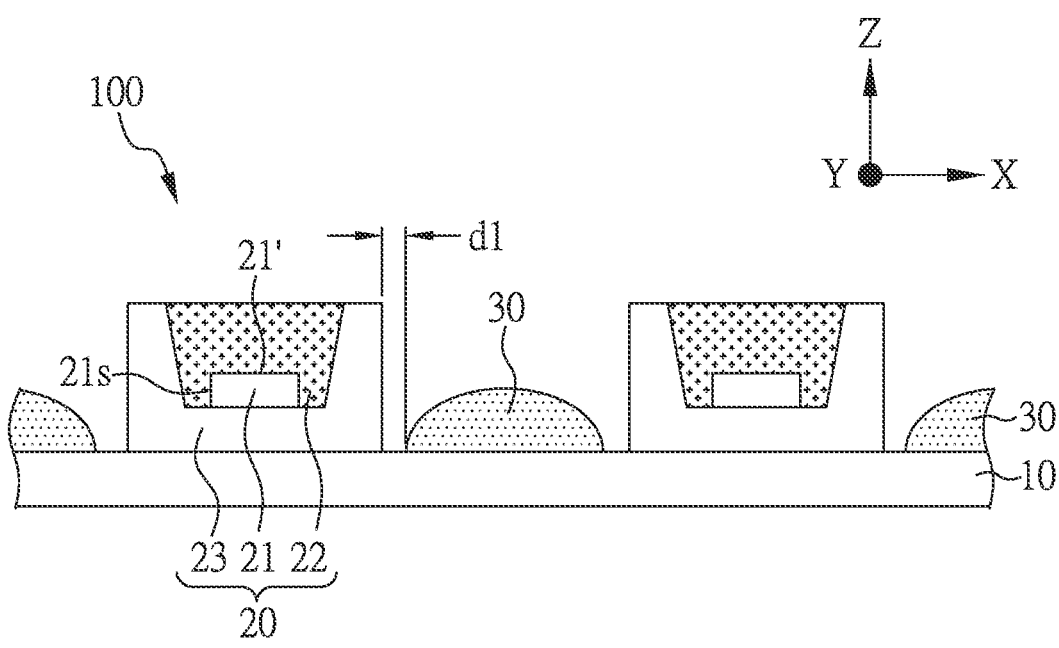
FIG. 2A is a schematic cross-sectional view of FIG. 1 along the line A-A'.

FIG. 1 is a schematic top view of a portion of a light emitting module 100 according to one embodiment of the present disclosure. FIG. 2A is a schematic cross-sectional view of FIG. 1 along the line A-A'.

As shown in FIG. 1 and FIG. 2A, the light emitting module100 of the present disclosure comprises: a substrate 10; a plurality of light emitting units 21 disposed on the substrate 10; a plurality of encapsulating elements 22 covering the light emitting units 21; and a reflective layer 30 surrounding each of the light emitting units 21. The plurality of encapsulating elements 22 may respectively cover the plurality of light emitting units 21. As shown in FIG. 2A, the encapsulating elements 22 may cover the light emitting units 21 to protect the light emitting units 21. More specifically, the encapsulating elements 22 may cover top surfaces 21' of the light emitting units 21. According to some embodiments, the encapsulating elements 22 may cover side walls 21s of the light emitting units 21.

In the present disclosure, the substrate 10 may be a rigid substrate or a flexible substrate. The material of the substrate 10 may comprise glass, metal, alloy, ceramic materials, or plastic materials, but the present disclosure is not limited thereto. The plastic materials may be, for example, polyimide (PI), polyethylene terephthalate (PET), or polymethylmethacrylate (PMMA), etc., but the present disclosure is not limited thereto. In the present disclosure, the plurality of light emitting units 21 may be light emitting diode (LED) chips, and the LED chips may be encapsulated through a packaging process first, and then the encapsulated light emitting units 21 are disposed on the substrate 10. For example, as shown in FIG. 2A, the light emitting units 21 are encapsulated by the encapsulating elements 22 to form the encapsulated light emitting units 20, and then the encapsulated light emitting units 20 are disposed on the substrate 10. In some embodiment, the encapsulated light emitting unit 20 may comprise a housing 23. In some embodiment, the encapsulated light emitting unit 20 may not comprise the housing 23. In some embodiments, the encapsulated light emitting units 20 may comprise phosphors or quantum dots (not shown in the figure). Alternatively, according to some embodiments, the light emitting units 21 may be directly disposed on the substrate 10 through the chip-on-board (COB) technique, and then the light emitting units 21 are encapsulated by the encapsulating elements 22, as shown in FIG. 4B. In one aspect of the present disclosure, the plurality of light emitting units 21 may be disposed on the substrate 10 through the chip scale package (CSP) process. The material of the encapsulating elements 22 may be a transparent material, which may protect the LED chips and the interconnect circuits, etc., without affecting the light emitting from the phosphors or quantum dots. Suitable materials for the encapsulating elements 22 may comprise epoxy, silicone, acrylic, polymethylmethacrylate, or a combination thereof, but the present disclosure is not limited thereto.

In some embodiments, the substrate 10 may comprise electronic components (not shown in the figure) which may be electrically connected to the light emitting units 21. The electronic components may be, for example, transistors. The substrate 10 may be a circuit board, for example, a printed circuit board (PCB) or a flexible printed circuit board (FPC).

In the present disclosure, the reflective layer 30 may comprise a glue material and a reflective material. After curing, the reflective layer 30 may have a reflectivity greater than or equal to 85% and less than or equal to 98%. According to some embodiments, the reflectivity of the reflective layer 30 may be greater than or equal to 88% and less than or equal to 96%. According to some embodiments, the reflectivity of the reflective layer 30 may be greater than or equal to 90% and less than or equal to 95%. According to some embodiments, the reflectivity of the reflective layer 30 may be greater than or equal to 92% and less than or equal to 95%. However, the reflectivity of the reflective layer 30 is not limited to the aforesaid range in the present disclosure. Specific examples of the glue material may comprise epoxy resin, phenolic resin, rubber, silicone, polyurethane, polyacrylate, or a combination thereof, but the present disclosure is not limited thereto. The reflective material may include pigments, for example, white pigments. Specific examples of the reflective material may comprise titanium dioxide, aluminum oxide, zinc oxide, zirconium oxide or a combination thereof, but the present disclosure is not limited thereto. In the present disclosure, the reflective layer 30 may be formed on the substrate 10 through any suitable coating process (for example, spin coating or dispensing) or laminating process. In the present disclosure, the reflective layer 30 can be placed closer to the light emitting units 21 due to the leveling properties of the glue material, so the reflective area of the reflective layer 30 can be increased and the light output of the light emitting module100 can be increased. According to some embodiments, the reflective layer 30 may comprise the glue material, and the reflective layer 30 can be closer to the light emitting units 21, so that the light output of the light emitting module100 can be increased due to the reflectivity of the reflective layer 30.

As shown in FIG. 1 and FIG. 2A, in the present disclosure, a plurality of housings 23 may also be provided, and the light emitting units 21 and the encapsulating elements 22 may be disposed in the housings 23. Thus, the packaged light emitting unit 20 may comprise the light emitting unit 21, the encapsulating element 22 and the housing 23. The plurality of encapsulated light emitting units 20 may be arranged along a first direction X and a second direction Y, and the first direction X and the second direction Y are respectively perpendicular to the top view direction Z of the substrate 10. The first direction X and the second direction Y are different, for example, the first direction X and the second direction Y may be perpendicular to one another. There may be a first distance d1 between the reflective layer 30 and the housing 23. Herein, the first distance d1 may be the distance between the reflective layer 30 and the housing 23 in the first direction X. When measuring the first distance d1 in the first direction X, a parallel line parallel to the first direction X and passing through the light emitting unit 21 can be defined (the line A-A' in FIG. 1), and the distance between the edge 30e of the reflective layer 30 and the housing 23 is measured along this parallel line (the line A-A' in FIG. 1). According to some embodiments, the first distance d1 may be the distance between the reflective layer 30 and the housing 23 in the second direction Y. When measuring the first distance d1 in the second direction Y, a parallel line L parallel to the second direction Y and passing through the light emitting unit 21 can be defined, and the distance between the edge 30e of the reflective layer 30 and the housing 23 is measured along this parallel line L. As shown in FIG. 2A, the first distance d1 may be greater than 0 mm and less than or equal to 0.4 mm, but the present disclosure is not limited thereto. According to some embodiments, as shown in FIG. 1, in the top view direction Z of the substrate 10, the edge 30e of the reflective layer 30 may be non-linear. For example, the edge 30e has a curved edge. According to other embodiments, in the top view direction Z of the substrate 10, the edge 30e of the reflective layer 30 may include a linear edge.

Figure 2B:
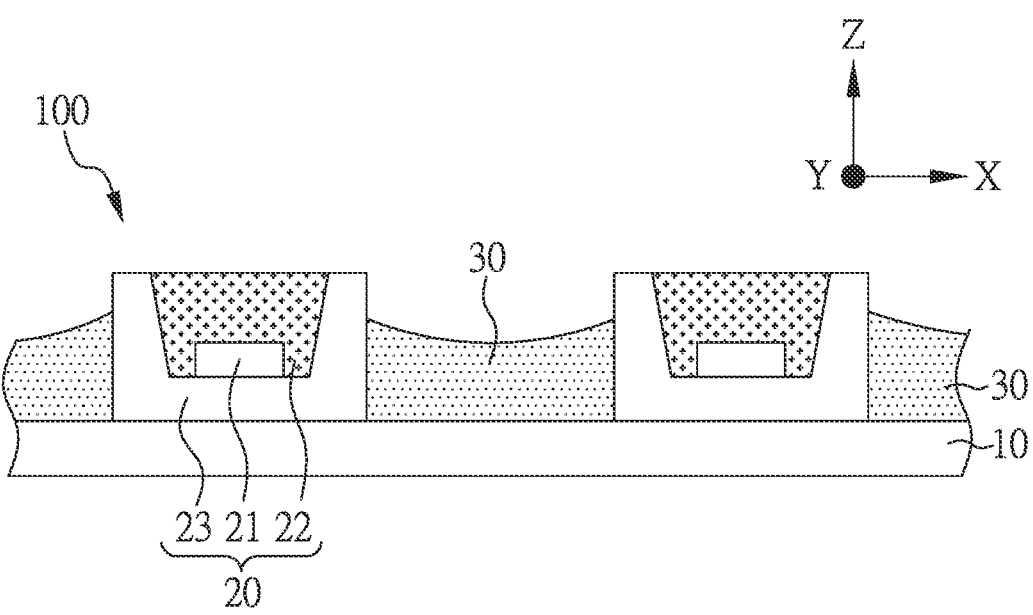
FIG. 2B is a schematic cross-sectional view of a portion of a light emitting module according to one embodiment of the present disclosure.

In another embodiment of the present disclosure, as shown in FIG. 2B, the reflective layer 30 may be in contact with the encapsulated light emitting units 20. In other words, the distance between the reflective layer 30 and the encapsulated light emitting unit 20 may be 0 mm. More specifically, the distance between the reflective layer 30 and the housing 23 may be 0 mm; and in other words, the reflective layer 30 may be filled in the space between at least two adjacent encapsulated light emitting units 20. Thus, in the present disclosure, the reflective layer 30 may be disposed closer to the light emitting units 21. More specifically, the first distance d1 may be designed to be greater than or equal to 0 mm and less than or equal to 0.4 mm, so that the reflective area of the reflective layer 30 may be increased to increase the overall light output of the light emitting module 100.

According to some embodiments, the light emitting units 20 may not comprise the housings 23. In this case, the first distance d1 may be the distance between the reflective layer 30 and the encapsulating element 22. The description of the first distance d1 can be referred to the foregoing and is not repeated again. In addition, as shown in FIG. 1, in the top view direction Z, the outline of the reflective layer 30 surrounding the light emitting unit 21 is irregular. However, in one aspect of the present disclosure, although not shown in the figure, in the top view direction Z, the outline of the reflective layer 30 surrounding the light emitting unit 21 may be circular, elliptical, or rectangular, but the present disclosure is not limited thereto.

In the present disclosure, the light emitting module100 may further comprise an optical film (not shown in the figure) disposed on the substrate 10, and the light emitting units 21 may be disposed between the optical film and the substrate 10. Herein, the optical film may be a light guide plate, a diffuser, a brightness enhancement film or a combination thereof, but the present disclosure is not limited thereto.

Figures 3A, 3B:
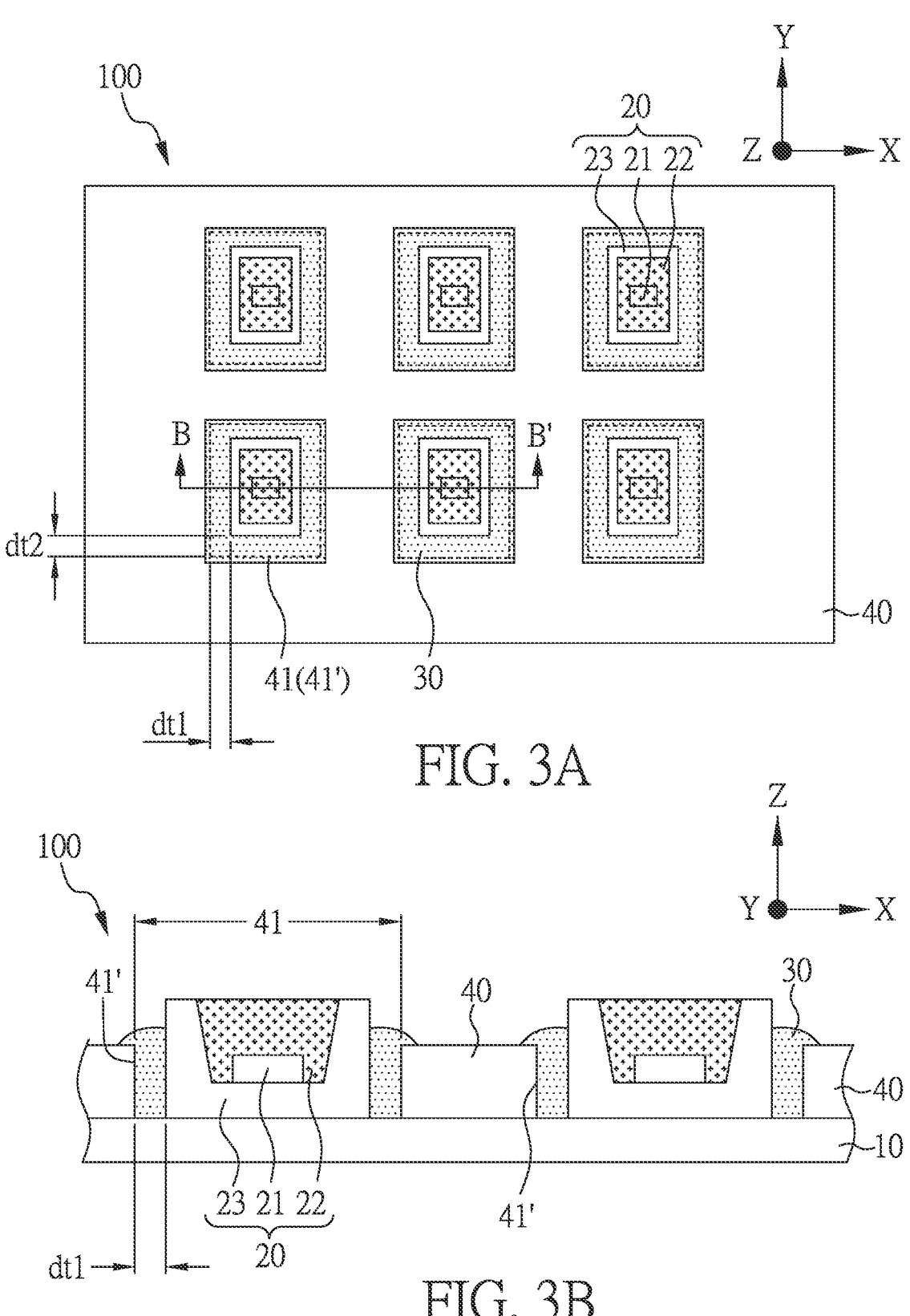
FIG. 3A is a schematic top view of a portion of a light emitting module according to one embodiment of the present disclosure.
FIG. 3B is a schematic cross-sectional view of FIG. 3A along the line B-B'.

FIG. 3A is a schematic top view of a portion of a light emitting module100 according to one embodiment of the present disclosure. FIG. 3B is a schematic cross-sectional view of FIG. 3A along the line B-B'. The light emitting module100 shown in FIG. 3A and FIG. 3B is similar to the light emitting module100 shown in FIG. 1, except for the following differences.

In one embodiment of the present disclosure, as shown in FIG. 3A and FIG. 3B, the light emitting module100 may further comprise a reflective sheet 40 disposed on the substrate 10, wherein the reflective sheet 40 comprises a plurality of openings 41. According to some embodiments, at least one light emitting unit 21 may be disposed in one opening 41. More specifically, at least one encapsulated light emitting unit 20 may be disposed in one opening 41. In the present disclosure, the reflective layer 30 may further be disposed in the openings 41 and surrounding each of the light emitting units 21. In the present embodiment, the reflective layer 30 and the reflective sheet 40 are used together and the reflective layer 30 is disposed in the openings 41 of the reflective sheet 40, so that the loss of the reflective area caused by the openings 41 of the reflective sheet 40 can be compensated. Hence, the overall reflective area can further be improved to increase the light output of the light emitting module 100.

In one embodiment of the present disclosure, as shown in FIG. 3B, a portion of the reflective layer 30 may be disposed on the reflective sheet 40. In other words, as shown in FIG. 3A, in the top view direction Z of the substrate 10, the reflective layer 30 and the reflective sheet 40 may be partially overlapped. In addition, even not shown in the figure, in other aspects of the present disclosure, the reflective layer 30 and the reflective sheet 40 may not be overlapped in the top view direction Z of the substrate 10. For example, the distance between the reflective layer 30 and the reflective sheet 40 may be 0 mm. Alternatively, there may be a distance between the reflective layer 30 and the reflective sheet 40, and this distance may be less than or equal to 0.4 mm.

Furthermore, as shown in FIG. 3B, in the present embodiment, the first distance between the reflective layer 30 and the housing 23 is 0 mm. Although not shown in the figure, in other aspects of the present disclosure, the first distance between the reflective layer 30 and the housing 23 may be greater than 0 mm and less than or equal to 0.4 mm.

In the present disclosure, the sizes of the openings 41 are not particularly limited. As shown in FIG. 3A, in the first direction X, there is a first minimum distance dt1 between the opening edge 41' and the housing 23 in the first direction X, there is a second minimum distance dt2 between the opening edge 41' and the housing 23 in the second direction Y, and the first minimum distance dt1 and the second minimum distance dt2 may be greater than the first distance between the reflective layer 30 and the housing 23. In addition, in the present embodiment, the shape of the opening 41 of the reflective sheet 40 may be rectangular, but the present disclosure is not limited thereto. In other embodiments of the present disclosure, the shape of the opening 41 may be circular, elliptical or irregular; but the present disclosure is not limited thereto.

In the present disclosure, the reflectivity of the reflective sheet 40 may be greater than or equal to 95%, and less than or equal to 100% (for example, may be ranged from 96% to 98%, but the present disclosure is not limited thereto). The material of the reflective sheet 40 may be metal (for example, Ag or Al), or plastic materials (for example, polyimide or polyethylene terephthalate), etc., but the present disclosure is not limited thereto.

In one embodiment of the present disclosure, the reflectivity of reflective layer 30 may be less than the reflectivity of the reflective sheet 40, and a difference between the reflectivity of the reflective layer 30 and the reflectivity of the reflective sheet 40 is less than or equal to 10%. For example, the difference between the reflectivity of the reflective layer 30 and the reflectivity of the reflective sheet 40 is less than or equal to 5%. However, the present disclosure is not limited thereto.

Figure 4A:
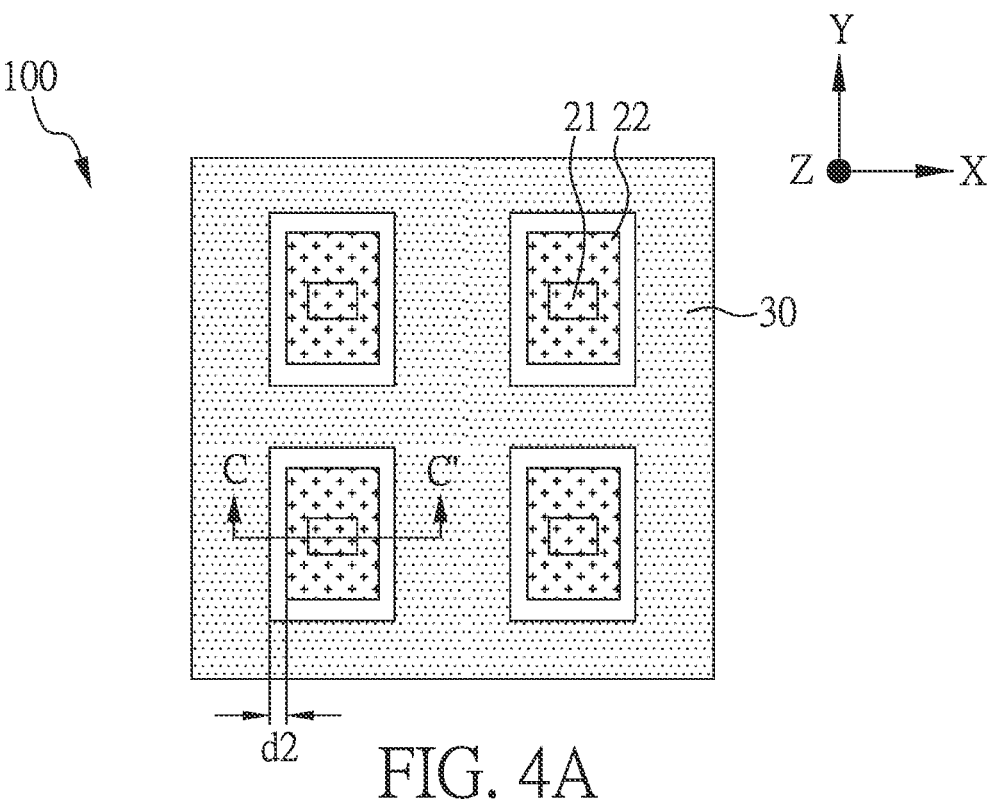
FIG. 4A is a schematic top view of a portion of a light emitting module according to one embodiment of the present disclosure.
Figure 4B:
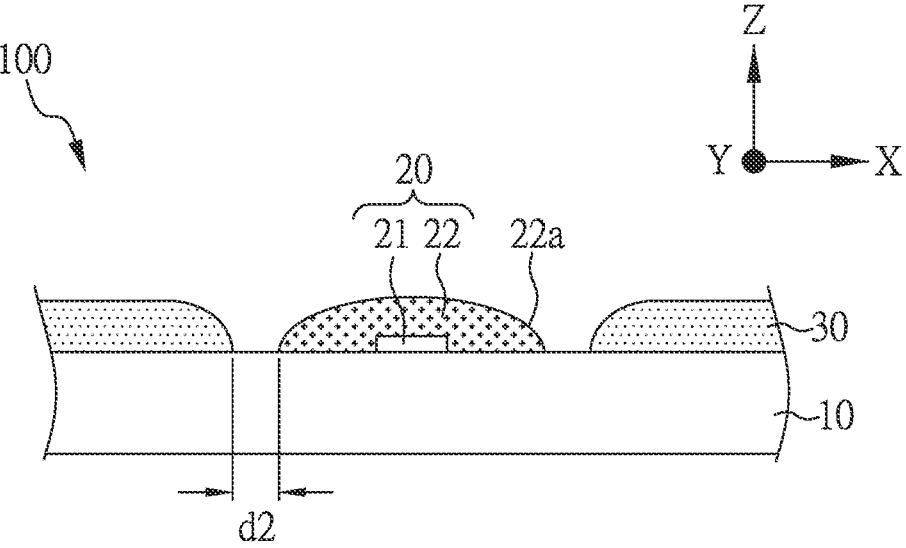
FIG. 4B is a schematic cross-sectional view of FIG. 4A along the line C-C'.

FIG. 4A is a schematic top view of a portion of a light emitting module100 according to one embodiment of the present disclosure. FIG. 4B is a schematic cross-sectional view of FIG. 4A along the line C-C'. The light emitting module100 shown in FIG. 4A and FIG. 4B is similar to the light emitting module100 shown in FIG. 1, except that the light emitting units 21 (i.e. the LED chips) are disposed on the substrate 10 through the chip-on-board (COB) technique.

As shown in FIG. 4A and FIG. 4B, the light emitting module100 of the present disclosure comprises: a substrate 10; a plurality of light emitting units 21 disposed on the substrate 10; a plurality of encapsulating elements 22 covering the light emitting units 21; and a reflective layer 30 surrounding each of the light emitting units 21. The plurality of light emitting units 21 may be disposed on the substrate 10 first, and then encapsulated by the encapsulating elements 22. Thus, one light emitting unit 21 and one encapsulating element 22 can form one encapsulated light emitting unit 20. As shown in FIG. 4A, the reflective layer 30 is spaced apart from at least one of the encapsulating elements 22. More specifically, there is a second distance d2 between the reflective layer 30 and the encapsulating element 22. The second distance d2 may be the distance in the first direction X, wherein a parallel line parallel to the first direction X and passing through the light emitting unit 21 can be defined (the line C-C' in FIG. 4A), and the second distance d2 is the distance between the reflective layer 30 and the encapsulating element 22 measured along this parallel line (the line C-C' in FIG. 4A). The second distance d2 may be greater than 0 mm and less than or equal to 0.4 mm. When the second distance d2 are designed to be within the aforesaid range, the reflective area of the reflective layer 30 may be increased, and the overall light output of the light emitting module100 may be increased. The encapsulating elements 22 may be disposed on the light emitting units 21 and the substrate 10 though a coating process. In addition, as shown in FIG. 4B, in a cross-sectional view, the encapsulating element 22 in the encapsulated light emitting unit 20 may have a curved edge 22a.

In addition, in the present embodiment, since the light emitting units 21 are directly disposed on the substrate 10, the disposition of other elements (for example, the housing) may be reduced to save cost or space. In one embodiment of the present disclosure, the substrate 10 may be a printed circuit board, but the present disclosure is not limited thereto.

Figure 4C:
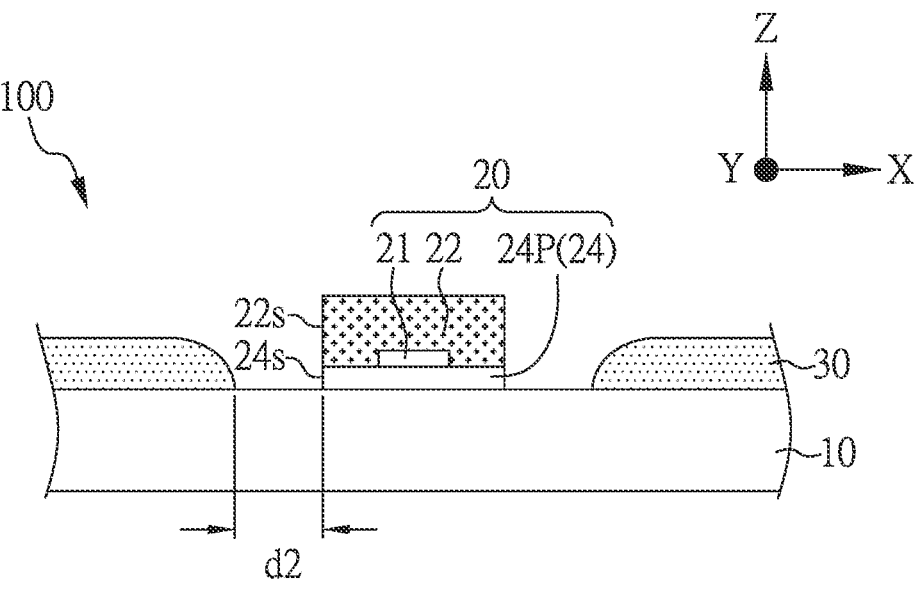
FIG. 4C is a schematic cross-sectional view of FIG. 4A along the line C-C' according to another aspect.

FIG. 4C is a schematic cross-sectional view of FIG. 4A along the line C-C' according to another aspect. The light emitting module100 shown in FIG. 4C is similar to the light emitting module100 shown in FIG. 4B, except for the following differences.

As shown in FIG. 4C, the encapsulated light emitting units 20 may be formed by chip scale package (CSP). More specifically, the light emitting unit 21 (which may be a light emitting chip) may be disposed on another substrate 24, and then the light emitting unit 21 is encapsulated by the encapsulating element 22. Then, the encapsulated light emitting unit 20 is formed by a cutting process. The cutting process may be a laser cutting process, but the present disclosure is not limited thereto. The encapsulated light emitting unit 20 has the chip scale. The encapsulated light emitting unit 20 may include light emitting unit 21, the encapsulating element 22 and the connecting substrate portion 24P formed after cutting. Then, a plurality of encapsulated light emitting units 20 are disposed on the substrate 10, and the connecting substrate portion 24P may be disposed between the light emitting unit 21 and the substrate 10.

Then, the reflective layer 30 is applied onto the substrate 10, and the reflective layer 30 surrounds each of the light emitting units 21 to form the light emitting module100 of the present disclosure. In the present disclosure, the coating process for forming the reflective layer 30 is not particularly limited. For example, the reflective layer 30 may be applied onto the substrate 10 first, and then the encapsulated light emitting units 20 are formed on the substrate 10. Alternatively, the encapsulated light emitting units 20 may be disposed on the substrate 10 first, and then the reflective layer 30 is applied on to the substrate 10. After the cutting process, the encapsulated light emitting units 20 formed in the present aspect may have the shape similar to rectangle. More specifically, as shown in FIG. 4C, in the encapsulated light emitting units 20, a side wall 22s of the encapsulated light emitting unit 20 may be aligned with a side wall 24s of the connecting substrate portion 24P formed after cutting.

Figure 4D:
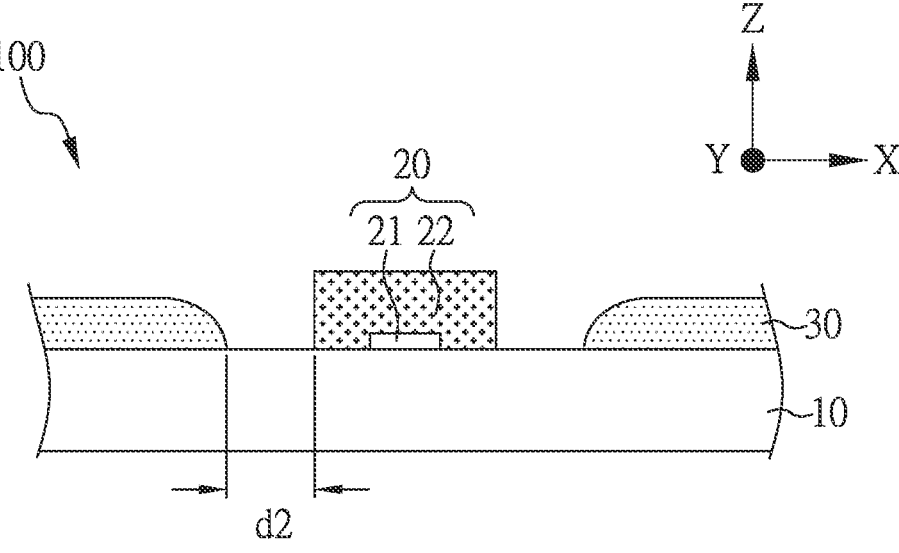
FIG. 4D is a schematic cross-sectional view of FIG. 4A along the line C-C' according to further another aspect.

FIG. 4D is a schematic cross-sectional view of FIG. 4A along the line C-C' according to another aspect. The light emitting module100 shown in FIG. 4D is similar to the light emitting module100 shown in FIG. 4C, except for the following differences.

The encapsulated light emitting unit 20 shown in FIG. 4D may also be formed by chip scale package (CSP). As shown in FIG. 4D, the similar process used in the aspect of FIG. 4C may be used to prepare the light emitting module100 of the present aspect, except that the encapsulated light emitting unit 20 of the present aspect may not comprise another substrate 24 (as shown in FIG. 4C). In other words, another substrate 24 (as shown in FIG. 4C) is not disposed between the light emitting unit 21 and the substrate 10. Thus, the purpose of thinning may be realized. Similarly, the encapsulated light emitting unit 20 formed in the present aspect after the cutting process may have the shape similar to rectangle.

Figure 5A:
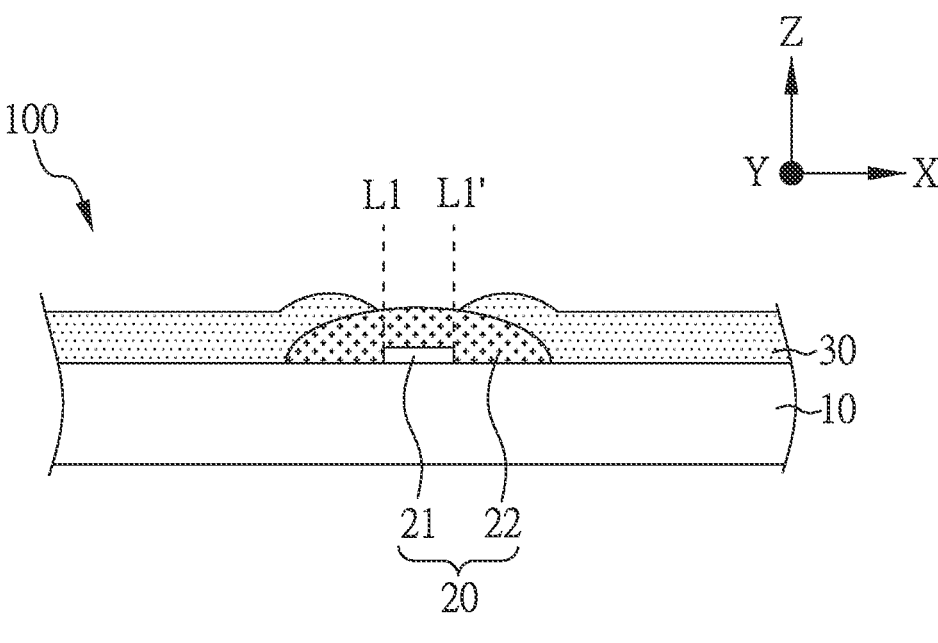
FIG. 5A and FIG. 5B are schematic cross-sectional views of a portion of a light emitting module according to other embodiments of the present disclosure.
Figure 5B:
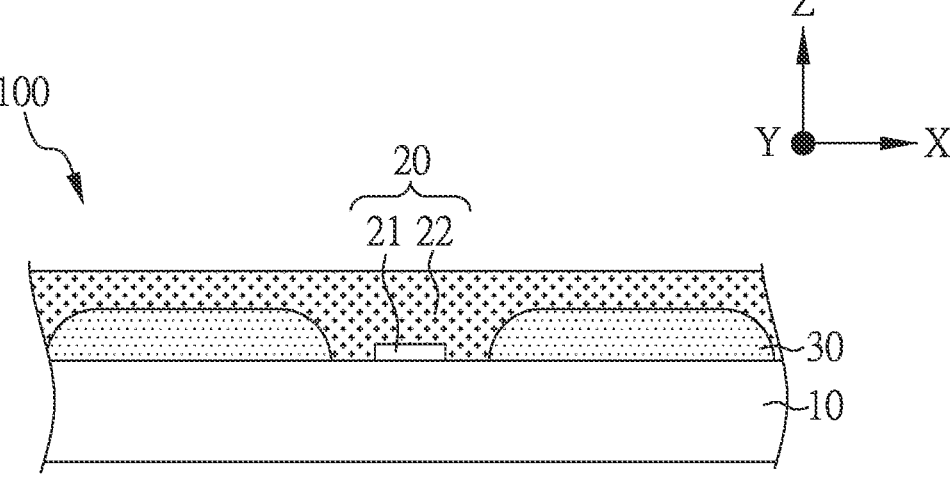

FIG. 5A and FIG. 5B are schematic cross-sectional views of a portion of a light emitting module according to other embodiments of the present disclosure. The light emitting modules 100 shown in FIG. 5A and FIG. 5B are similar to those shown in FIG. 4A and FIG. 4B, except for the following differences.

As shown in FIG. 5A, the encapsulated light emitting unit 20 comprises the light emitting unit 21 and the encapsulating element 22. The reflective layer 30 may be in contact with the encapsulating element 22, and a portion of the reflective layer 30 may be disposed on at least one of the encapsulating elements 22. Thus, the reflective area of the reflective layer 30 may further be increased to increase the overall light output of the light emitting module100. In addition, the edges of the light emitting unit 21 have edge extension lines L1, L1' in the top view direction Z of the substrate 10, wherein the portion of the reflective layer 30 disposed on the encapsulating element 22 may not be overlapped with the edge extension lines L1, L1', i.e. the reflective layer 30 is not overlapped with the light emitting unit 21, to avoid affecting the amount of the light emitting by the light emitting unit 21.

In addition, even not shown in the figure, the encapsulated light emitting unit 20 shown in FIG. 5A may be substituted with the encapsulated light emitting unit 20 shown in FIG. 4C or FIG. 4D to form the light emitting module100 of the present disclosure. The preparation method and the advantages thereof are similar to those shown in the embodiments of FIG. 4C or FIG. 4D, and are not repeated again.

FIG. 5B is a schematic cross-sectional view of a portion of a light emitting module100 according to another embodiment of the present disclosure. As shown in FIG. 5B, the reflective layer 30 may be in contact with the encapsulating element 22, and the encapsulating element 22 may be formed on the reflective layer 30. More specifically, in the present embodiment, the encapsulating element 22 may be formed on the entire surface to improve the reliability, but the present disclosure is not limited thereto. In other embodiments of the present disclosure, the encapsulating element 22 may be partially formed. For example, the encapsulating element 22 may be formed on the portion of the reflective layer 30 close to the light emitting unit 21, and the rest portion of the reflective layer 30 are not coated with the encapsulating element 22.

Figure 6A:
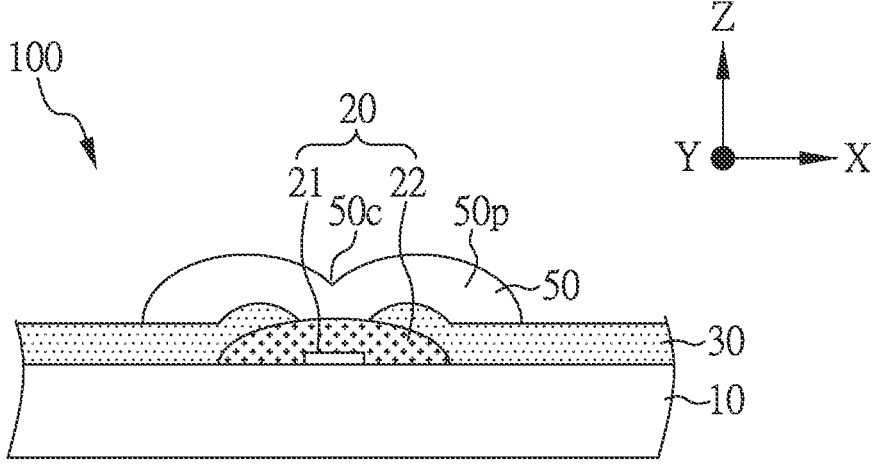
FIG. 6A is a schematic cross-sectional view of a portion of a light emitting module according to one embodiment of the present disclosure.

FIG. 6A is a schematic cross-sectional view of a portion of a light emitting module100 according to one embodiment of the present disclosure. The light emitting module100 shown in FIG. 6A is similar to that shown in FIG. 5A, except for the following differences.

As shown in FIG. 6A, the encapsulated light emitting unit 20 comprises the light emitting unit 21 and the encapsulating element 22. The light emitting module100 of the present embodiment may further comprise a lens 50 disposed on the encapsulated light emitting unit 20. More specifically, the lens 50 may be disposed on at least one of the encapsulating element 22. In the top view direction Z of the substrate 10, the lens 50 may be overlapped with the light emitting unit 21 to expand the light emitting angle and/or area of the light source and improve the light quality. In the present embodiment, the lens 50 may be disposed on the reflective layer 30, but the present disclosure is not limited thereto. According to some embodiments, the lens 50 may comprise convex portions 50*p* and a concave portion 50*c*, and the concave portion 50*c* locates between two convex portions 50*p*. The position of the concave portion 50*c* may correspond to the light emitting unit 21, i.e. the concave portion 50*c* may be overlapped with the light emitting unit 21 in the top view direction Z of the substrate 10.

In the present disclosure, the material of the lens 50 is not particularly limited. For example, the material of the lens 50 may be silicone, polymethylmethacrylate, polycarbonate, or glass, etc., but the present disclosure is not limited thereto. In addition, the lens 50 may be prepared by similar or the same material for forming the encapsulating element 22.

Furthermore, even not shown in the figure, the encapsulated light emitting unit 20 shown in FIG. 6A may be substituted with the encapsulated light emitting unit 20 shown in FIG. 4C or FIG. 4D to form the light emitting module100 of the present disclosure. The preparation method and the advantages thereof are similar to those shown in the embodiments of FIG. 4C or FIG. 4D, and are not repeated again.

Figure 6B:
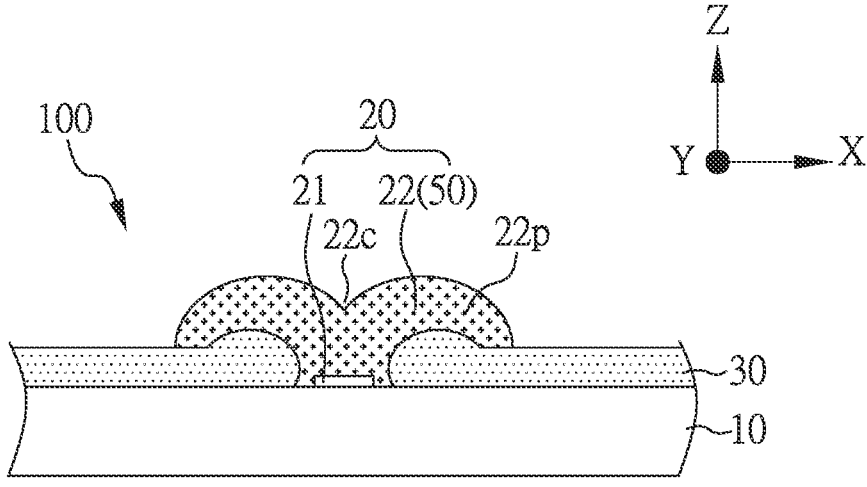
FIG. 6B is a schematic cross-sectional view of a portion of a light emitting module according to another embodiment of the present disclosure.

FIG. 6B is a schematic cross-sectional view of a portion of a light emitting module100 according to another embodiment of the present disclosure. The light emitting module100 shown in FIG. 6B is similar to that shown in FIG. 5B, except for the following differences.

The light emitting module100 of the present embodiment may further comprise a lens 50. More specifically, as shown in FIG. 6B, the encapsulating element 22 covers the light emitting unit 21, and the encapsulating element 22 may be disposed on the reflective layer 30. The encapsulating element 22 may comprise convex portions 22*p* and a concave portion 22*c*, and the concave portion 22*c* locates between two convex portions 22*p*. The position of the concave portion 22*c* may correspond to the light emitting unit 21, i.e. the concave portion 22*c* may be overlapped with the light emitting unit 21 in the top view direction Z of the substrate 10. In the present embodiment, the encapsulating element 22 may have the encapsulating function to package to the light emitting unit 21, and also have the light-expending effect of the lens. Thus, the encapsulating element 22 can also be used as the lens 50 to simplify the preparation process. In addition, in the present embodiment, the encapsulating element 22 may be partially formed, but the present disclosure is not limited thereto.

Figure 7A:
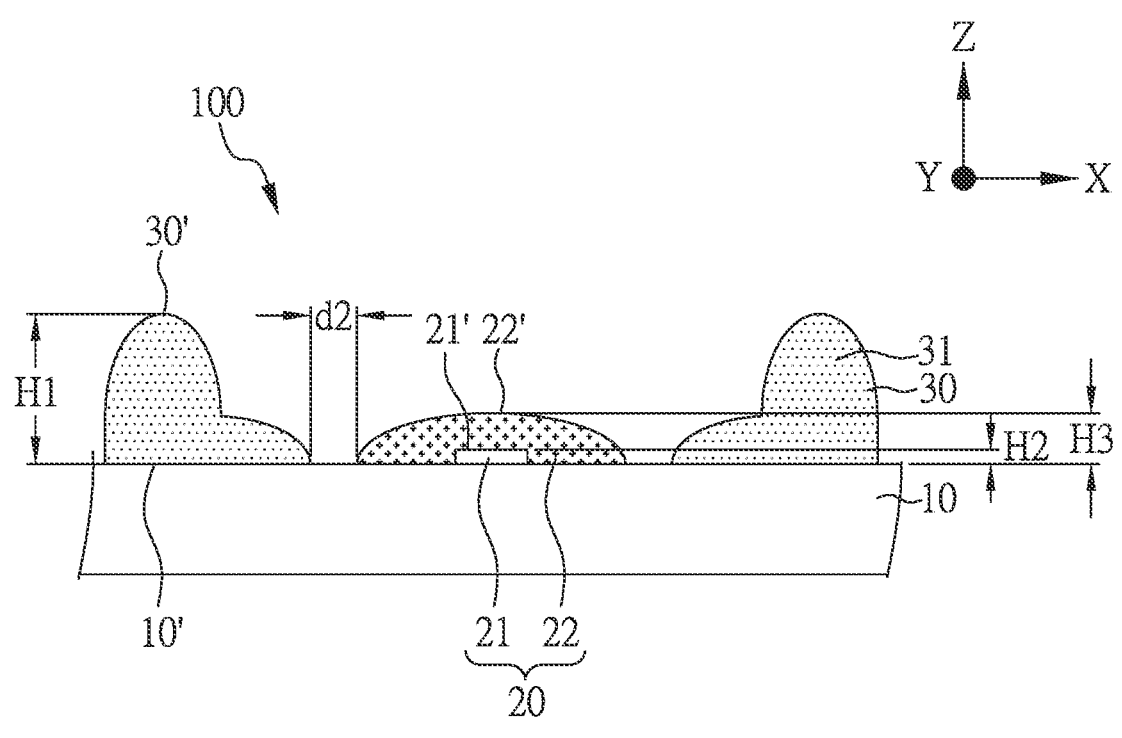
FIG. 7A is a schematic cross-sectional view of a portion of a light emitting module according to one embodiment of the present disclosure.

FIG. 7A is a schematic cross-sectional view of a portion of a light emitting module100 according to one embodiment of the present disclosure. The light emitting module100 shown in FIG. 7A is similar to those shown in FIG. 4A and FIG. 4B, except for the following differences.

As shown in FIG. 7A, the encapsulated light emitting unit 20 comprises the light emitting unit 21 and the encapsulating element 22. In one embodiment of the present disclosure, the reflective layer 30 may have a wall structure 31. More specifically, a height H1 of the wall structure 31 may be greater than a height H2 of the light emitting unit 21. According to some embodiments, the height H1 of the wall structure 31 may be greater than a height H3 of the encapsulated light emitting unit 20. More specifically, in the top view direction Z of the substrate 10, the height H1 may be the first maximum height H1 between the top surface 30' of the reflective layer 30 and the top surface 10' of the substrate 10. The height H2 may be the second maximum height H2 between the top surface 21' of the light emitting unit 21 and the top surface 10' of the substrate 10. The height H3 may be the third maximum height H3 between the top surface 22' of the encapsulating element 22 and the top surface 10' of the substrate 10. The light emitting by the light emitting unit 21 may be further reflected by the wall structure 31 of the reflective layer 30 to reduce the light leakage of the light emitting unit 21 and improve the contrast.

In addition, even not shown in the figure, the encapsulated light emitting unit 20 shown in FIG. 7A may be substituted with the encapsulated light emitting unit 20 shown in FIG. 4C or FIG. 4D to form the light emitting module100 of the present disclosure. The preparation method and the advantages thereof are similar to those shown in the embodiments of FIG. 4C or FIG. 4D, and are not repeated again.

Figure 7B:
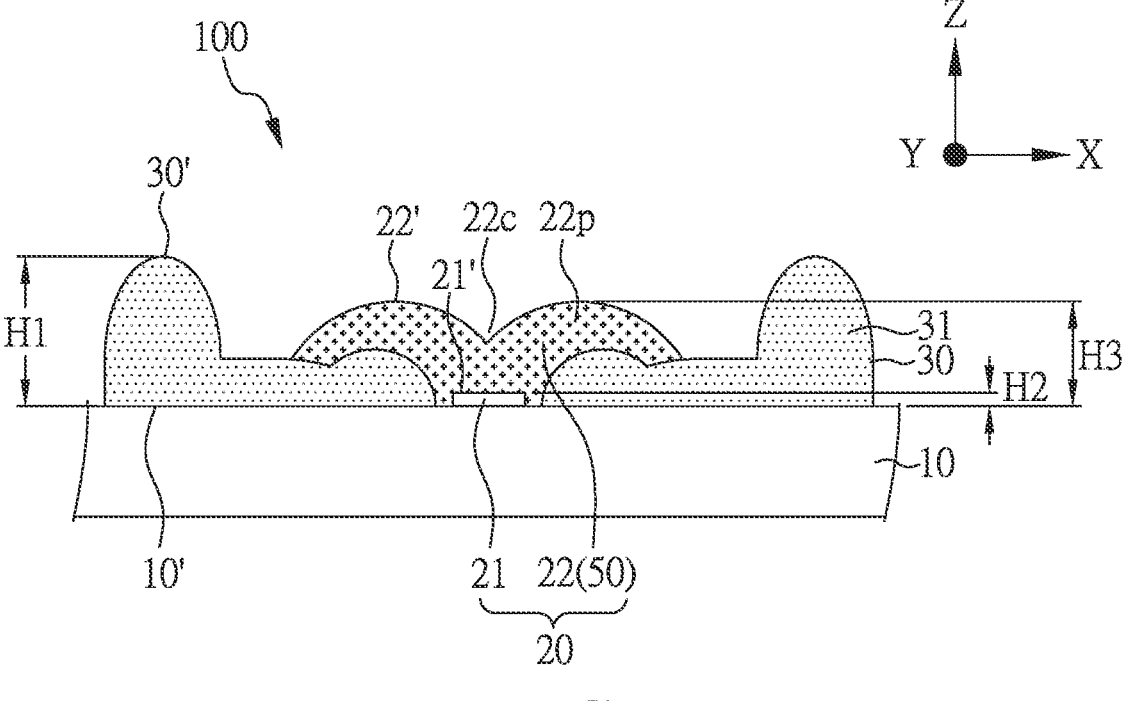
FIG. 7B is a schematic cross-sectional view of a portion of a light emitting module according to another embodiment of the present disclosure.

FIG. 7B is a schematic cross-sectional view of a portion of a light emitting module100 according to another embodiment of the present disclosure. Similar to the embodiment shown in FIG. 7A, the reflective layer 30 of the present embodiment may have a wall structure 31. More specifically, a height H1 of the wall structure 31 may be greater than a height H2 of the light emitting unit 21. According to some embodiments, the height H1 of the wall structure 31 may be greater than a height H3 of the encapsulated light emitting unit 20. More specifically, in the top view direction Z of the substrate 10, the height H1 may be the first maximum height H1 between the top surface 30' of the reflective layer 30 and the top surface 10' of the substrate 10. The height H2 may be the second maximum height H2 between the top surface 21' of the light emitting unit 21 and the top surface 10' of the substrate 10. The height H3 may be the third maximum height H3 between the top surface 22' of the encapsulating element 22 and the top surface 10' of the substrate 10. The light emitting by the light emitting unit 21 may be further reflected by the wall structure 31 of the reflective layer 30 to reduce the light leakage of the light emitting unit 21.

In addition, as shown in FIG. 7B, in the present embodiment, the light emitting module100 may further comprise a lens 50, the encapsulating element 22 covers the light emitting unit 21, and the encapsulating element 22 may be disposed on the reflective layer 30. The encapsulating element 22 may comprise convex portions 22p and a concave portion 22c, and the concave portion 22c locates between two convex portions 22p. The position of the concave portion 22c may correspond to the light emitting unit 21, i.e. the concave portion 22c may be overlapped with the light emitting unit 21 in the top view direction Z of the substrate 10. In the present embodiment, the encapsulating element 22 may have the encapsulating function to package to the light emitting unit 21, and also have the light-expending effect of the lens. Thus, the encapsulating element 22 can also be used as the lens 50 to simplify the preparation process.

Figure 8:
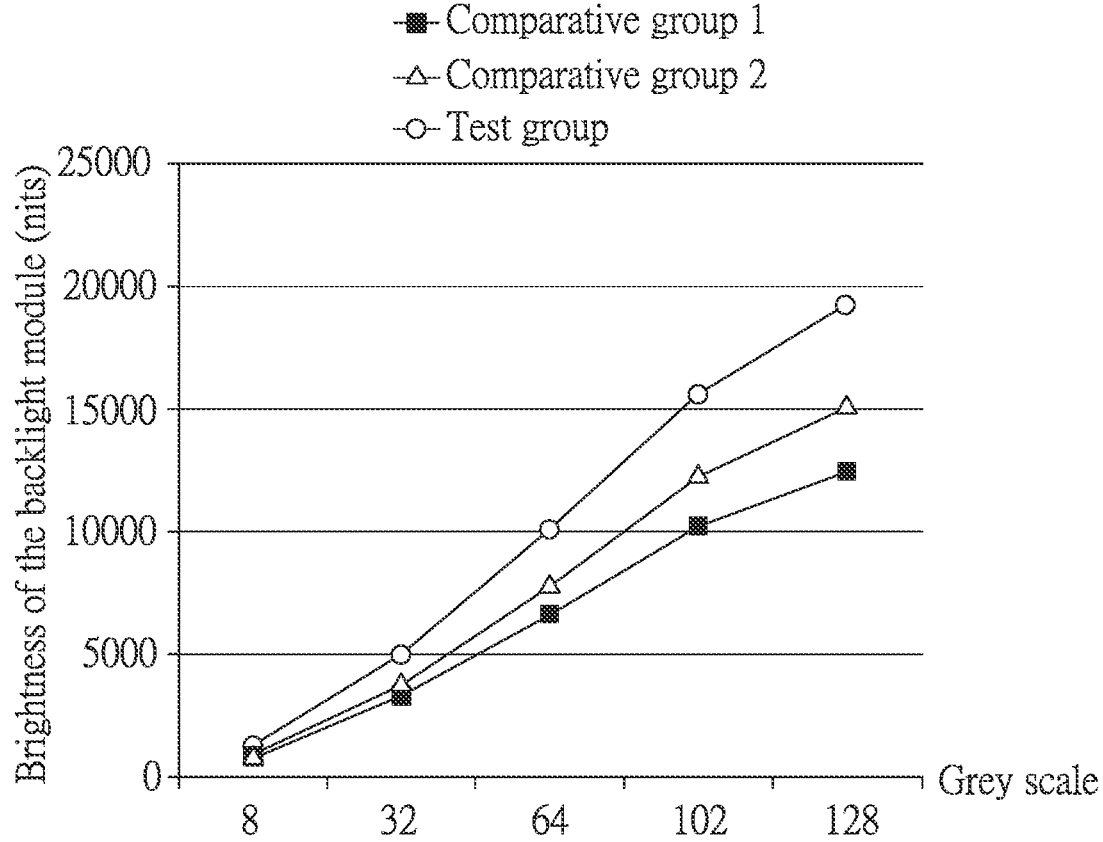
FIG. 8 shows test results of brightness of a light emitting module according to one embodiment of the present disclosure.

FIG. 8 shows test results of brightness of a light emitting module100 according to one embodiment of the present disclosure. Herein, the light emitting module100 shown in FIG. 2B is used in the test group. The light emitting module with the commercial reflective sheet 40 is used in the comparative group. The structure of the light emitting modules 100 in the comparative groups can be referred to those shown in FIG. 3A and FIG. 3B, but the light emitting modules 100 in the comparative groups does not comprise the reflective layer 30. In the light emitting module100 shown in FIG. 2B, the first distance between the reflective layer 30 and the housing 23 is 0 mm. In the light emitting module of the comparative group 1, the first minimum distance dt1 between the opening edge 41' of the reflective sheet 40 and the housing 23 is 0.7 mm, and the second minimum distance dt2 is 0.9 mm. In the light emitting module of the comparative group 2, the first minimum distance dt1 between the opening edge 41' of the reflective sheet 40 and the housing 23 is 0.3 mm, and the second minimum distance dt2 is 0.4 mm.

As shown in FIG. 8, in different gray levels, the brightness of the light emitting module in the test group is greater than the brightness of the light emitting modules in the comparative groups. Even though the opening of the reflective sheet is reduced, the brightness enhancement effect is limited. These results indicate that the overall light output of the light emitting module100 of the present disclosure can be effectively increased.

When the brightness of the light emitting module in the test group is set as 100%, the data shown in FIG. 8 are summarized in the following Table 1.

TABLE 1

| Gray scale | 8 | 32 | 64 | 102 | 128 |
|---|---|---|---|---|---|
| Comparative group 1 | 65.8% | 66.6% | 65.6% | 65.5% | 64.8% |
| Comparative group 2 | 72.7% | 76.7% | 77.9% | 78.9% | 78.6% |
| Test group | 100% | 100% | 100% | 100% | 100% |

According to the data shown in Table 1, when the opening of the reflective sheet is reduced, the overall brightness of the light emitting module may be increased about 14%. However, the opening of the reflective sheet has its limit due to the assembly tolerance of the manufacturing process. On the other hand, the overall brightness of the light emitting module of the present disclosure may be increased about 35%, so the light output of the light emitting module can be greatly improved.

Figure 9:
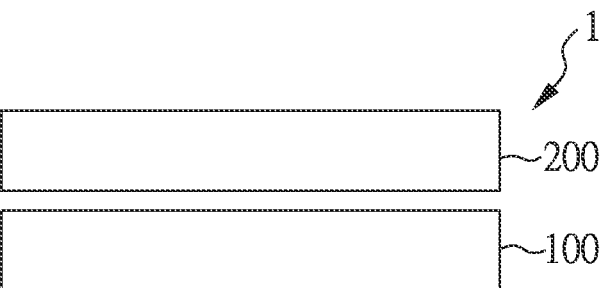
FIG. 9 is a schematic view of a display device according to one embodiment of the present disclosure.

FIG. 9 is a schematic view of a display device 1 according to one embodiment of the present disclosure. As shown in FIG. 9, the display device 1 of the present disclosure comprises: a light emitting module 100; and a display panel 200 disposed on the light emitting module100. In the present embodiment, the light emitting module100 may be used as a backlight module to provide light source to the display panel 200. Herein, the light emitting module100 may be any one shown in FIG. 1 to FIG. 7B, but the present disclosure is not limited thereto. Even not shown in the figure, the light emitting module100 of the present disclosure may further comprise any aspects shown in the aforesaid embodiments, and are not repeated again. The display device 1 assembled in this way includes the light emitting module100 with enhanced overall light output, so the display quality of the display device 1 can be improved.

According to some embodiments, the light emitting module100 may be directly used as a display device without being combined with a display panel. According to some embodiments, a plurality of light emitting modules 100 may be spliced into one display device.

In addition, the display device 1 may be a bendable or flexible display device. The display device 1 may include, for example, a tiled display device, but the present disclosure is not limited thereto. In addition, the appearance of the display device 1 may include a rectangle, a circle, a polygon, a shape with a curved edge, or other suitable shapes. Furthermore, the display device 1 may be applied to any electronic devices that need to display a screen known in the art, such as displays, mobile phones, laptops, video cameras, cameras, music players, mobile navigation devices, televisions, and other electronic devices that need to display images. Moreover, the aforesaid display panel 200 may also be used together with a touch panel to form a touch display device.

In conclusion, according to some embodiments, the light emitting module comprises a reflective layer and a plurality of light emitting units, and the reflective layer surrounds the plurality of light emitting units. According to some embodiments, the light emitting module comprises a reflective layer, a reflective sheet and a plurality of light emitting units, at least one of the light emitting units is disposed in one opening of the reflective sheet, a reflectivity of the reflective layer is less than a reflectivity of the reflective sheet, and a difference between the reflectivity of the reflective layer and the reflectivity of the reflective sheet is less than or equal to 10%. According to some embodiments, the reflective layer has greater reflective area, or the reflective layer may enhance the reflection effect of the light emitting module, to increase the light output of the light emitting module.

The above specific embodiments should be construed as merely illustrative, and not limiting the rest of the present disclosure in any way, and the features between different embodiments can be mixed and matched as long as they do not conflict with each other.

Although the present disclosure has been explained in relation to its embodiment, it is to be understood that many other possible modifications and variations can be made without departing from the spirit and scope of the disclosure as hereinafter claimed.

What is claimed is:
1. A light emitting module, comprising:
a substrate;
a reflective layer disposed on a surface of the substrate, wherein the reflective layer comprises a first reflective portion, a second reflective portion and a third reflective portion, a first opening is disposed between the first reflective portion and the second reflective portion, and a second opening is disposed between the second reflective portion and the third reflective portion;
a first encapsulated light emitting unit disposed in the first opening of the reflective layer, wherein the first encapsulated light emitting unit comprises a first light emitting unit and a first encapsulating element covering the first light emitting unit; and
a second encapsulated light emitting unit disposed adjacent to the first encapsulated light emitting unit, and disposed in the second opening of the reflective layer, wherein the second encapsulated light emitting unit comprises a second light emitting unit and a second encapsulating element covering the second light emitting unit,
wherein in a direction perpendicular to the surface of the substrate, the first encapsulating element of the first encapsulated light emitting unit is not overlapped with the reflective layer, and the second encapsulating element of the second encapsulated light emitting unit is not overlapped with the reflective layer;
wherein the second reflective portion is disposed between the first encapsulated light emitting unit and the second encapsulated light emitting unit, and the second reflective portion of the reflective layer comprises another surface opposite to the surface of the substrate, and the another surface of the second reflective portion of the reflective layer comprises a recess concaving toward the substrate.
2. The light emitting module of claim 1, wherein the reflective layer is in contact with the plurality of encapsulating elements.
3. The light emitting module of claim 2, wherein a portion of the reflective layer is disposed on at least one of the plurality of encapsulating elements.
4. The light emitting module of claim 1, further comprising a lens disposed on at least one of the plurality of encapsulating elements.

5. The light emitting module of claim 1, wherein at least one of the first encapsulating element and the second encapsulating element is a lens.
6. The light emitting module of claim 1, wherein a reflectivity of the reflective layer is greater than or equal to 85% and less than or equal to 98%.
7. The light emitting module of claim 1, wherein the reflective layer comprises a glue material.
8. The light emitting module of claim 1, further comprising a reflective sheet having a plurality of openings, wherein at least one of the plurality of light emitting units is disposed in at least one of the plurality of openings, and a portion of the reflective layer is disposed in the at least one of the plurality of openings.
9. The light emitting module of claim 8, wherein a reflectivity of the reflective layer is less than a reflectivity of the reflective sheet, and a difference between the reflectivity of the reflective layer and the reflectivity of the reflective sheet is less than or equal to 10%.
10. The light emitting module of claim 9, wherein the difference between the reflectivity of the reflective layer and the reflectivity of the reflective sheet is less than or equal to 5%.
11. The light emitting module of claim 1, further comprising a first housing, the first encapsulated light emitting unit comprises the first housing, and the first light emitting unit and the first encapsulating element are disposed in the first housing.
12. The light emitting module of claim 1, wherein the reflective layer has a wall structure.
13. The light emitting module of claim 12, wherein a height of the wall structure is greater than heights of the plurality of light emitting units.
14. The light emitting module of claim 12, wherein a height of the wall structure is greater than heights of the plurality of encapsulating elements.
15. A display device, comprising:
a light emitting module, comprising:
a substrate;
a reflective layer disposed on a surface of the substrate, wherein the reflective layer comprises a first reflective portion, a second reflective portion and a third reflective portion, a first opening is disposed between the first reflective portion and the second reflective portion, a second opening is disposed between the second reflective portion and the third reflective portion;
a first encapsulated light emitting unit disposed in the first opening of the reflective layer, wherein the first encapsulated light emitting unit comprises a first light emitting unit and a first encapsulating element covering the first light emitting unit; and
a second encapsulated light emitting unit disposed adjacent to the first encapsulated light emitting unit, and disposed in the second opening of the reflective layer, wherein the second encapsulated light emitting unit comprises a second light emitting unit and a second encapsulating element covering the second light emitting unit,
wherein in a direction perpendicular to the surface of the substrate, the first encapsulating element of the first encapsulated light emitting unit is not overlapped with the reflective layer, and the second encapsulating element of the second encapsulated light emitting unit is not overlapped with the reflective layer;
wherein the second reflective portion is disposed between the first encapsulated light emitting unit and the second encapsulated light emitting unit, and the second reflective portion of the reflective layer comprises another surface opposite to the surface of the substrate, and the another surface of the second reflective portion of the reflective layer comprises a recess concaving toward the substrate; and a display panel disposed on the light emitting module.

\* \* \* \* \*